United States Patent [19]

Terashima

[11] Patent Number: 5,289,019
[45] Date of Patent: Feb. 22, 1994

[54] INSULATED GATE BIPOLAR TRANSISTOR

[75] Inventor: Tomohide Terashima, Fukuoka, Japan

[73] Assignee: Mitsubishi Denki Kabushiki Kaisha, Tokyo, Japan

[21] Appl. No.: 889,290

[22] Filed: May 28, 1992

[30] Foreign Application Priority Data

Jul. 24, 1991 [JP] Japan .................. 3-184565
Apr. 3, 1992 [JP] Japan .................. 4-81918

[51] Int. Cl.$^5$ .................. H01L 29/74; H01L 29/06; H01L 29/40
[52] U.S. Cl. .................. 257/139; 257/618; 257/621; 257/622
[58] Field of Search .............. 257/139, 378, 577, 138, 257/619, 622, 623

[56] References Cited

U.S. PATENT DOCUMENTS 4,646,117  2/1987  Temple .................. 257/139
5,079,602  1/1992  Harada .................. 257/622

FOREIGN PATENT DOCUMENTS 0327901   8/1989  European Pat. Off. .
4114349  11/1991  Fed. Rep. of Germany .
0234879   7/1989  Japan .
2-44776    2/1990  Japan .
2-144924   6/1990  Japan .
2-206174   8/1990  Japan .

OTHER PUBLICATIONS

Patent Abstracts of Japan, vol. 14, No. 244 (E-932) (4187), May 24, 1990, & JP-A-20-67-766, Mar. 7, 1990, Tadaharu Mimato, "Bipolar-Type Semiconductor Switching Device".
Patent Abstracts of Japan, vol. 14, No. 425 (E-977) (4368), Sep. 13, 1990, & JP-A-21-63-973, Jun. 25, 1990, Shinji Nishiura, "Insulated-Gate Type Bipolar Transistor".
Patent Abstracts of Japan, vol. 13, No. 301 (E-765) (3649), Jul. 11, 1989, & JP-A-1-80077, Mar. 24, 1989, Koichi Murakami, "Conductivity-Modulation MOS-FET".
Patent Abstracts of Japan, vol. 11, No. 254 (E-533) (2701), Aug. 18, 1987, & JP-A-62-063-472, Mar. 20, 1987, Masaru Kubo, et al., "Power MOS-FET".

Primary Examiner—Rolf Hille
Assistant Examiner—Wael Fahmy
Attorney, Agent, or Firm—Oblon, Spivak, McClelland, Maier & Neustadt

[57] ABSTRACT

There is disclosed an IGBT which includes an n+ layer (2A), an n− layer (2B), a p well region (3), an n+ diffusion region (4), a gate oxide film (5), a gate electrode (6) and an emitter electrode (8) around the upper major surface of a p+ substrate (1), similarly to conventional IGBTS. In the lower major surface of the p+ substrate (1) is formed an n+ diffusion region (10) which is adapted not to reach the n+ layer (2A). The n+ diffusion region (10) and p+ substrate (1) are connected to a collector electrode (9). When there is a small potential difference between the emitter and collector electrodes, holes are injected from the p+ substrate into the n− layer to provide a low ON-resistance. When the potential difference is large, a depletion layer extending from the n+ diffusion region is brought into a reach-through state to limit an increase in the amount of injected holes. This prevents the device from being broken down due to an excessively increased current density.

2 Claims, 23 Drawing Sheets

INSULATED GATE BIPOLAR TRANSISTOR

BACKGROUND OF THE INVENTION

1. Field of the Invention

The present invention relates to an IGBT which is operated by a predetermined voltage applied to a gate electrode and to a method of fabricating the same.

2. Description of the Background Art

FIG. 24 is a cross-sectional view of a conventional insulated gate bipolar transistor (hereinafter referred to as an IGBT). An n+ epitaxial layer (hereinafter referred to as an n+ layer) 2A is formed on the upper major surface of a p+ substrate 1. An n− epitaxial layer (hereinafter referred to as an n− layer) 2B is formed on the n+ layer 2A. In the surface of the n− layer 2B is formed a p well region 3 provided by the diffusion of p-type impurities. In the surface of the p well region 3 is formed an n+ diffusion region 4 provided by the selective diffusion of n-type impurities.

A gate oxide film 5 is formed over the surface of the p well region 3 which is between the n+ diffusion region 4 and n− layer 2B. A gate electrode 6 made of polysilicon is formed in the gate oxide film 5. An emitter electrode 8 made of metal is provided in contact with the n+ diffusion region 4 and p well region 3. The emitter electrode 8 and the gate electrode 6 are insulated from each other through an interlayer oxide film 7. On the lower major surface of the p+ substrate 1 is formed a collector electrode 9 made of metal.

The IGBT thus constructed operates as follows. When the emitter electrode 8 and the gate electrode 6 are at the same potential and positive bias is applied to the drain electrode 9, a depletion layer extends from a pn junction formed by the p well region 3 and n− layer 2B toward the n− layer 2B. This holds the voltage in the OFF-state. Increasing the positive bias, the depletion layer extends up to the n+ layer 2A and then stops, the depletion layer is prevented from reaching the p+ substrate 1 and being brought into a reach-through state.

When the gate electrode 6 is positive-biased relative to the emitter electrode 8, n-inversion occurs to form an n-channel in the p well layer 3 immediately under the gate electrode 6, so that electrons flow from the n+ diffusion region 4 through the n-channel to the n− layer 2B. The voltage retention in the p well region 3 and n− layer 2B goes eliminated, and the potential between the p+ substrate 1 and the n+ layer 2A is in the forward direction so that holes flow from the n− layer 2B to the p well region 3. The modulation by the holes injected from the p+ substrate 1 increases the concentration of electrons in the n− layer 2B, so that a low ON-resistance is provided. When the gate electrode 6 and the emitter electrode 8 are made to be again at the same potential, the n-channel disappears and the voltage retention between the p well region 3 and n− layer 2B restarts. The potential between the p+ substrate 1 and n+ layer 2A is no longer in the forward direction, and the injection of holes stops. The holes which have already been injected in the n− layer 2B successively reach the p well region 3, and the resultant tail current causes power loss. To reduce the tail current, a recombination center is introduced by doping the n− layer 2B with heavy metal or by irradiation of electron beams and the lifetime of carriers is shortened. For the low ON-resistance, in general, it is effective to increase the resistivity of the n+ layer 2A, to decrease the thickness thereof, or to prolong the lifetime of the carriers. A device of low ON-resistance, however, is easily broken down by an excessive collector-emitter voltage, if applied, in the ON-state because of an excessively large current density.

In the conventional IGBT which is optimized under normal use conditions and has the low ON-resistance, there arises a problem that an excessive collector-emitter voltage (e.g., short-circuit), if applied in the ON-state, increases forward bias between the p+ substrate 1 and the n+ layer 2A and the amount of injected holes, and causes the excessively increased current density, resulting in the breakdown of the device.

On the other hand, another problem is that, when the excessive increase in current density is restrained to prevent the breakdown, the current density under the normal use conditions decreases, resulting in an increased ON-resistance.

SUMMARY OF THE INVENTION

According to the present invention, an IGBT comprises a first conductivity type of first semiconductor layer having first and second major surfaces; a second conductivity type of second semiconductor layer formed on the first major surface of the first semiconductor layer; a first conductivity type of third semiconductor layer selectively formed in a surface of the second semiconductor layer which is opposite to the first semiconductor layer; a second conductivity type of fourth semiconductor layer selectively formed in a surface of the third semiconductor layer; an insulative layer formed on part of the surface of the third semiconductor layer which is between the second and fourth semiconductor layers; a control electrode formed in the insulative layer; a first electrode formed for connection to the third and fourth semiconductor layers; a second conductivity type of fifth semiconductor layer selectively formed in the second major surface of the first semiconductor layer in no contact with the second semiconductor layer; and a second electrode formed for connection to the first semiconductor layer on the second major surface and to the fifth semiconductor layer.

In another aspect of the present invention, an IGBT comprises a first conductivity type of first semiconductor layer having first and second major surfaces; a second conductivity type of second semiconductor layer formed on the first major surface of the first semiconductor layer; a first conductivity type of third semiconductor layer selectively formed in a surface of the second semiconductor layer which is opposite to the first semiconductor layer; a second conductivity type of fourth semiconductor layer selectively formed in a surface of the third semiconductor layer; a groove extending from the second major surface of the first semiconductor layer to the second semiconductor layer; an insulative layer formed on part of the surface of the third semiconductor layer which is between the second and fourth semiconductor layers; a control electrode formed in the insulative layer; a first electrode formed over the third and fourth semiconductor layers; a second conductivity type of fifth semiconductor layer, a first conductivity type of sixth semiconductor layer and a second conductivity type of seventh semiconductor layer of impurity concentration higher than that of the second semiconductor layer, which are stacked in order from inside of the groove; and a second electrode formed for connection to the first semiconductor layer on the second major surface and to the fifth and sixth semiconductor layers.

The present invention is also intended for a method of fabricating an IGBT. According to the present invention, the method comprises the steps of (a) forming a second conductivity type of second semiconductor layer on a first major surface of a first conductivity type of first semiconductor layer having the first major surface and a second major surface; (b) selectively forming a first conductivity type of third semiconductor layer in a surface of the second semiconductor layer which is opposite to the first semiconductor layer; (c) selectively forming a second conductivity type of fourth semiconductor layer in a surface of the third semiconductor layer; (d) forming an insulative layer on part of the surface of the third semiconductor layer which is between the second and fourth semiconductor layers, and a control electrode in the insulative layer, respectively; (e) forming a first electrode for connection to the third and fourth semiconductor layers; (f) selectively forming a second conductivity type of fifth semiconductor layer in the second major surface of the first semiconductor layer in no contact with the second semiconductor layer; and (g) forming a second electrode for connection to the first semiconductor layer on the second major surface and to the fifth semiconductor layer.

In another aspect of the present invention, a method of fabricating an IGBT comprises the steps of (a) forming a second conductivity type of second semiconductor layer on a first major surface of a first conductivity type of first semiconductor layer having the first major surface and a second major surface; (b) selectively forming a first conductivity type of third semiconductor layer in a surface of the second semiconductor layer which is opposite to the first semiconductor layer; (c) selectively forming a second conductivity type of fourth semiconductor layer in a surface of the third semiconductor layer; (d) forming an insulative layer on part of the surface of the third semiconductor layer which is between the second and fourth semiconductor layers, and a control electrode in the insulative layer, respectively; (e) forming a first electrode for connection to the third and fourth semiconductor layers; (f) forming a groove having an opening in the second major surface of the first semiconductor layer and extending to the second semiconductor layer; (g) forming in order from inside of the groove a second conductivity type of fifth semiconductor layer, a first conductivity type of sixth semiconductor layer and a second conductivity type of seventh semiconductor layer of impurity concentration higher than that of the second semiconductor layer; and (h) forming a second electrode for connection to the first semiconductor layer on the second major surface and to the fifth and sixth semiconductor layers.

In the insulated gate bipolar transistor according to the present invention, when the current density exceeds the normal value in the ON-state, the voltage drop by the current flowing in the first semiconductor layer restricts an increase in forward bias between the first and second semiconductor layers above the fifth semiconductor layer. Furthermore, the potential between the fifth and first semiconductor layers is in the reverse direction, and the depletion layer is brought into a reach-through state in part of the first semiconductor layer which is between the fifth and second semiconductor layers, so that carriers directly flow between the second and fifth semiconductor layers. This provides for the restriction of increase in the amount of carriers injected from the first semiconductor layer to the second semiconductor layer and prevents the excessive current density.

As above described, the present invention provides the insulated gate bipolar transistor which does not increase the ON-resistance in the ON-state because current easily flows between the first and second semiconductor layers at the normal current density and which prevents the excessive current flow because the depletion layer is in the reach-through state between the fifth and second semiconductor layers where the excessive collector-emitter voltage is applied, and the method of fabricating the same.

It is an object of the present invention to provide an IGBT which is, in an ON-state, capable of limiting an increase in ON-resistance at a normal current density and capable of preventing a current density from increasing excessively where an excessive collector-emitter voltage is applied.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
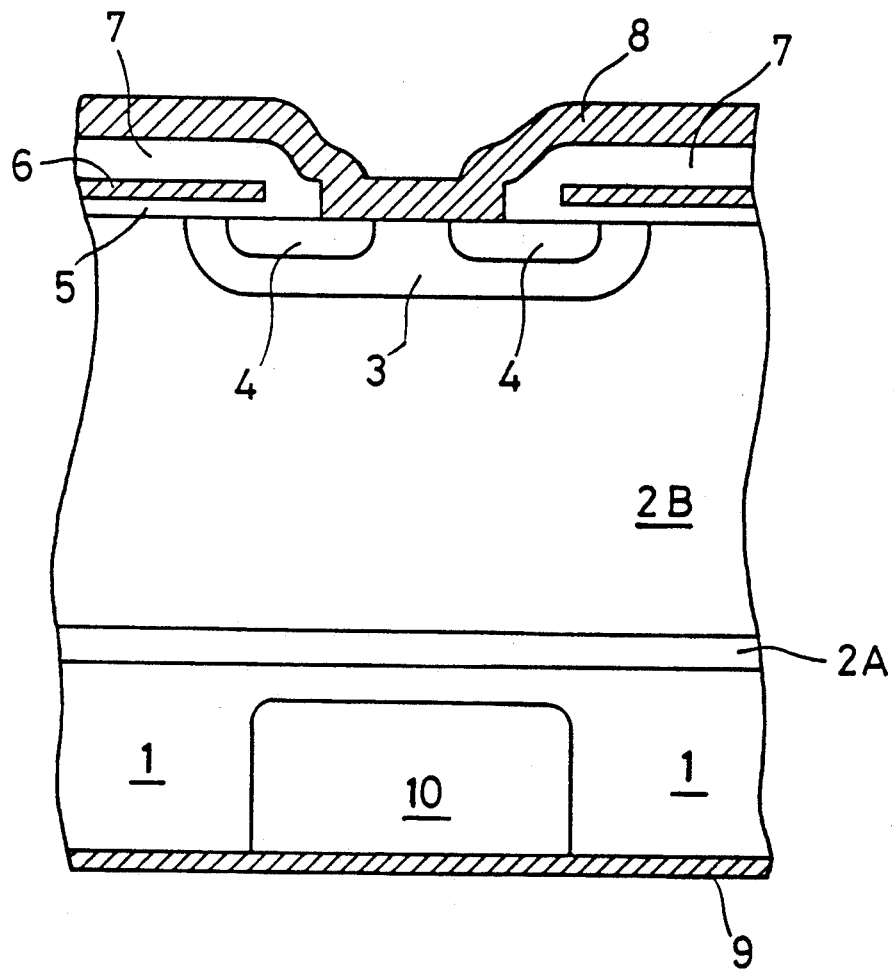
FIGS. 1 to 3 are cross-sectional views of a first preferred embodiment according to the present invention.

FIG. 1 is a cross-sectional view of an IGBT of a first preferred embodiment according to the present invention. An n+ layer 2A is formed on the upper major surface of a p+ substrate 1. An n− layer 2B is formed on the n+ layer 2A. In the surface of the n− layer 2B is formed a p well region 3 provided by the diffusion of p-type impurities. In the surface of the p well region 3 is formed an n+ diffusion region 4 provided by the selective diffusion of n-type impurities. An n+ diffusion region 10 is formed such that it extends from the lower major surface of the p+ substrate 1 not to reach the n+ layer 2A. A gate oxide film 5 is formed over the surface of the p well region 3 which is between the n+ diffusion region 4 and n− layer 2B. On the gate oxide film 5 is formed a gate electrode 6 made of polysilicon. An emitter electrode 8 made of metal is provided in contact with the n+ diffusion region 4 and p well region 3. The emitter electrode 8 and the gate electrode 6 are insulated from each other through an interlayer oxide film 7. A collector electrode 9 made of metal is formed on the lower major surface of the p+ substrate 1 and the n+ diffusion region 10.

In the IGBT thus constructed, when the emitter and gate electrodes 8 and 6 are at the same potential and positive bias is applied to the drain electrode 9, a depletion layer extends from a pn junction formed by the p well region 3 and n− layer 2B toward the n− layer 2B. This holds the voltage in the OFF-state. When the gate electrode 6 is positive-biased relative to the emitter electrode 8, n− inversion occurs to form an n-channel in the p well region 3 immediately under the gate electrode 6, so that electrons flow from the n+ diffusion region 4 through the n-channel to the n− layer 2B. The voltage retention in the p well region 3 and n− layer 2B goes eliminated, and the potential between the p+ substrate 1 and the n+ layer 2A is in the forward direction so that holes flow from the n− layer 2B to the p well region 3. The modulation by the holes injected from the p+ substrate 1 increases the concentration of electrons in the n− layer 2B, so that a low ON-resistance is provided. At the normal current density, the injection of holes is carried out in the whole junction between the n+ layer 2A and the p+ substrate 1. The resistance by the n+ diffusion region 10 prevents the injection of holes compared with the conventional construction. This is, however, sufficiently compensated for by increasing the resistivity of the n+ layer 2A or by decreasing the thickness thereof. A lower ON-resistance may be achieved by the larger amount of injected holes than in the conventional construction at the conventional current density.

Further increase in current density limits the increase in the amount of holes injected from the p+ substrate 1 between the n+ diffusion region 10 and the n+ layer 2A.

Figure 2:
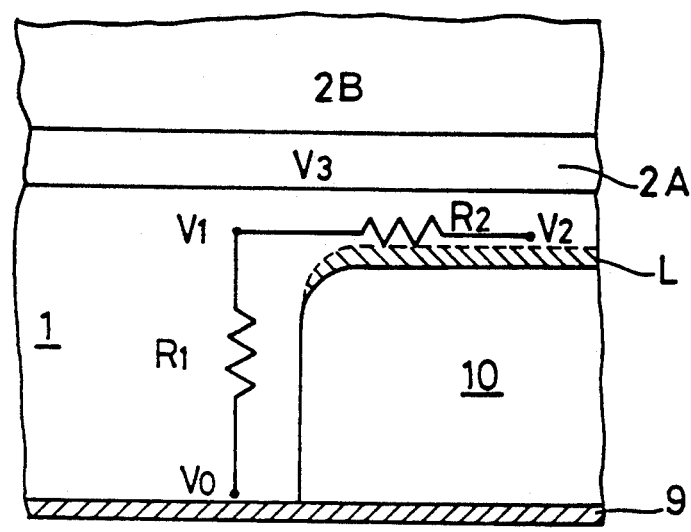

These situations are described below with reference to FIG. 2. Reference character $V_0$ designates a potential at the electrode 9; $V_1$ designates a potential at a part of the p+ substrate 1 which is adjacent to the junction between the p+ substrate 1 and the n+ layer 2A; $V_2$ designates a potential in the vicinity of the center of a part of the p+ substrate 1 which lies between the n+ diffusion region 10 and the n+ layer 2A; and $V_3$ designates a potential at the n+ layer 2A. Reference character R1 designates a resistance from the part of the p+ substrate 1 which is adjacent to the junction between the p+ substrate 1 and the n+ layer 2A to the electrode 9 under which the n+ diffusion region 10 is absent; and R2 designates a resistance from the vicinity of the center of the part of the p+ substrate 1 which lies between the n+ diffusion region 10 and the n+ layer 2A to the part of the p+ substrate 1 which is adjacent to the junction between the p+ substrate 1 and the n+ layer 2A under which the n+ diffusion region 10 is absent.

As a hole current from the electrode 9 increases, a voltage drop caused by the hole current flowing in the p+ substrate 1 and by the resistances R1 and R2 decreases the potentials $V_1$ and $V_2$ relative to $V_0$. The potential $V_2$ is lower than the potential $V_1$ by the amount of voltage drop at the resistance R2. Thus a forward bias $(V_2-V_3)$ in the vicinity of the center of the part of the p+ substrate 1 which lies between the n+ diffusion region 10 and the n+ layer 2A is smaller than a forward bias $(V_1-V_3)$ in the region under which the n+ diffusion region 10 is absent, so that the increase in the amount of holes injected from this part is limited.

Figure 3:
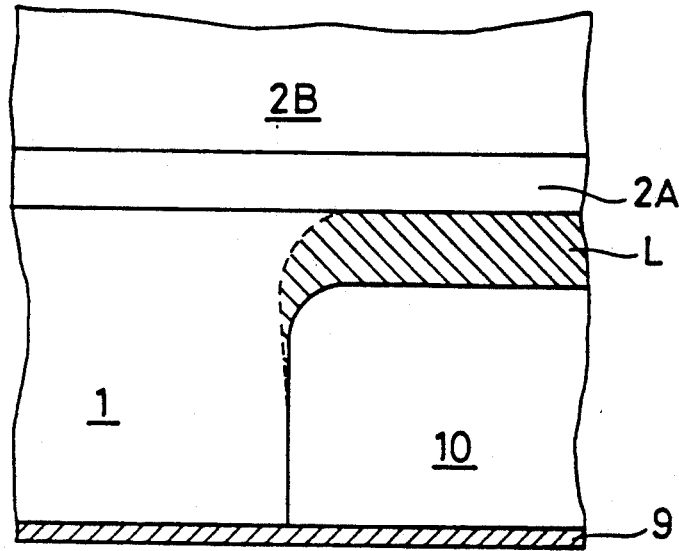

At the same time, a reverse bias $(V_0-V_2)$ is applied to the n+ diffusion region 10 and to the part of the p+ substrate 1 which lies between the n+ diffusion region 10 and the n+ layer 2A, and a depletion layer L extends into part of the p+ substrate 1. The resistance R2 increases, and the forward bias $(V_2-V_3)$ becomes less changed. The increase in the amount of holes injected from this part is limited. As the current density increases, the reverse bias increases. The depletion layer L extending into part of the p+ substrate 1 falls into a reach-through state, so that an electronic current directly flows into the n+ diffusion region 10, as shown in FIG. 3. In this state, the forward bias $(V_1-V_3)$ between the p+ substrate 1 and the n+ layer 2A is unliable to increase, and the amount of holes injected from the p+ substrate 1 into the n+ layer 2A is unliable to increase. As mentioned above, the amount of injected holes is equal to or larger than that in the conventional construction at the normal current density, and the increase in the amount of injected holes is limited when the current density increases to some extent or more by an applied excessive emitter-collector voltage (e.g., short-circuit). The IGBT is achieved which has the low ON-resistance at the normal current density and prevents the current density from increasing excessively.

This effect may be described from another viewpoint as follows: In the npn parasitic transistor which includes the n+ layer 2A serving as an emitter, the p+ substrate 1 serving as a base and the n+ diffusion region 10 serving as a collector, the base becomes depleted as the collector-emitter voltage thereof increases, whereby Hfe increases (Early effect). This prevents the current density of the IGBT from increasing excessively. The larger the Hfe of the npn parasitic transistor is, the larger the effect to prevent the excessive current density of the IGBT is.

Figure 4:
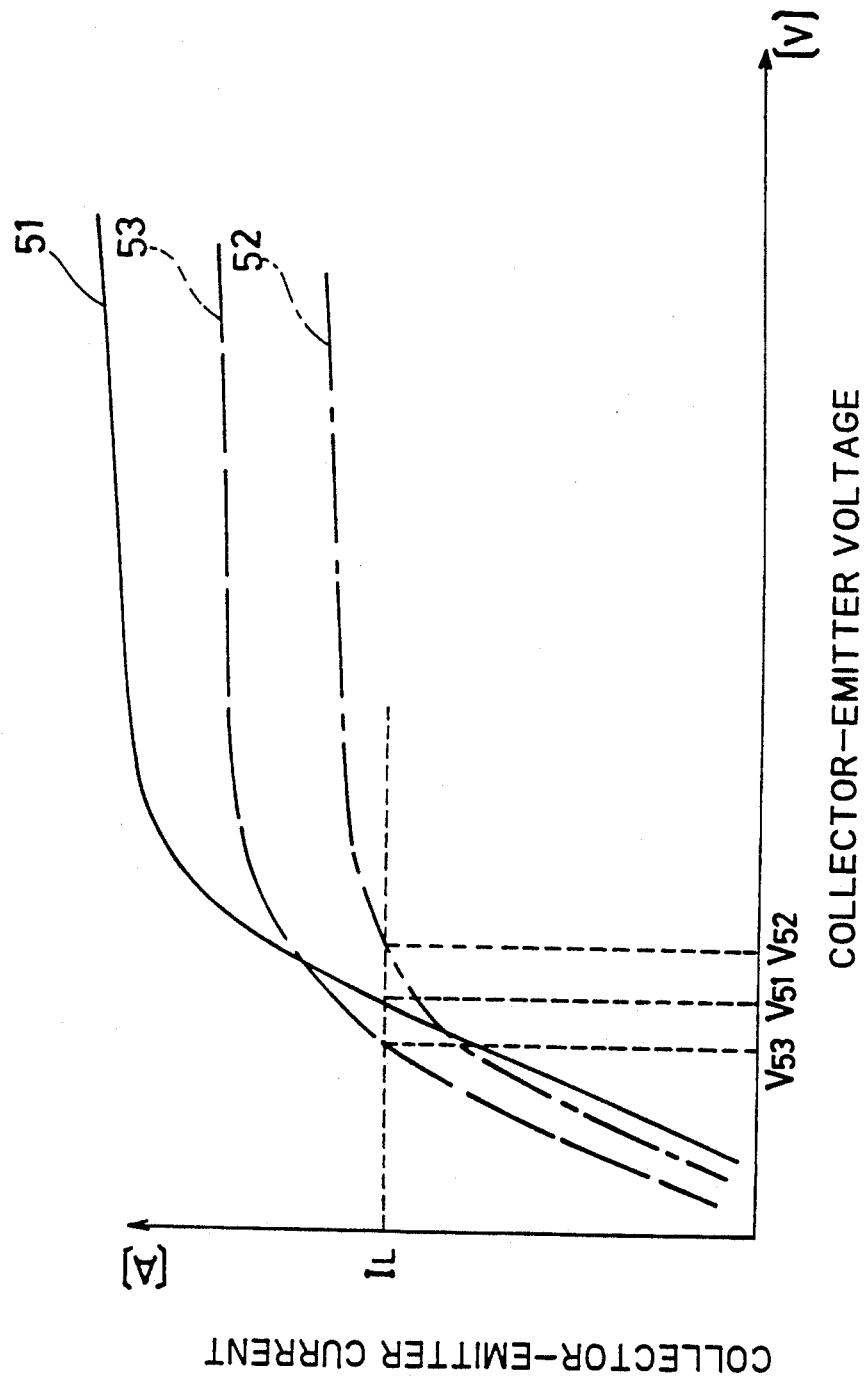
FIG. 4 is a graph showing the characteristics of the first preferred embodiment.

FIG. 4 shows the characteristics of a collector-emitter current with respect to the collector-emitter voltage in the first preferred embodiment. The curve 51 of FIG. 4 indicates the characteristics of the conventional IGBT. The curves 52 and 53 of FIG. 4 indicate the characteristics of the IGBT of the first preferred embodiment where the part of the p+ substrate 1 which lies between the n+ layer 2A and n+ diffusion region 10 is relatively low and high in impurity concentration, respectively. They are corresponding to the high and low Hfe of the npn parasitic transistor, respectively.

It is found from FIG. 4 that the currents indicated by both of the curves 52 and 53 are more limited than the current of the conventional IGBT (indicated by the curve 51). However, the potential $V_{52}$ of the curve 52 required to obtain a rated current $I_L$ is larger than the potential $V_{51}$ of the curve 51 required in the prior art, resulting in the increasing ON-resistance in the curve 52. The potential $V_{53}$ of the curve 53 required to obtain the rated current $I_L$ is smaller than the potential $V_{51}$, resulting in the decreasing ON-resistance in the curve 53.

It is thus preferable that the construction of the first preferred embodiment is adapted to avoid increase in ON-resistance. It has been found, as a result of research, that a voltage of 10 V or more is preferably required for the depletion layer L extending from the pn junction formed between the n+ diffusion region 10 and part of the p+ substrate 1 which lies between the n+ layer 2A and n+ diffusion region 10 toward the p+ substrate 1 to reach the n+ layer 2A and fall into the reach-through state. This represents that the Hfe of the npn parasitic transistor should not be too large.

For achievement of the preferable construction in the first preferred embodiment, it is necessary to suitably control a distance between the n+ diffusion region 10 and n+ layer 2A, that is, the thickness t of the p+ substrate 1 in a region wherein the depletion layer L falls into the reachthrough state and the impurity concentration P thereof.

It is assumed that the impurity concentration of the n+ diffusion region 10 is higher than that of the p+ substrate 1 and that the depletion layer L is formed only in the p+ substrate 1. When the impurity concentration is expressed by the function $\rho(u)$ of the distance u from the pn junction in the direction in which the depletion layer L extends, it is desired that the following formula is satisfied:

$$\frac{q}{\epsilon \epsilon_0} \int_0^t \left( \int_0^t \rho(u)du - \int_0^x \rho(u)du \right) dx =$$

$$\frac{q}{\epsilon_0 \epsilon} \int_0^t x\rho(x)dx > 10(V) \qquad (1)$$

where $\epsilon_0$, $\epsilon$, q are dielectric constant in a vacuum, relative dielectric constant of semiconductor, and electric charge of electrons, respectively. When the impurity concentration $\rho$ of the p+ substrate 1 is constant without regard to position, the following formula holds:

$$t^2\rho > 1.3 \times 10^8 \text{ cm}^{-1} \qquad (2)$$

For example, when the thickness t of the p+ substrate 1 is 5 μm, the impurity concentration $\rho$ of the p+ substrate 1 should be $5.17 \times 10^{14}$ cm$^{-3}$ or more.

Figure 5:
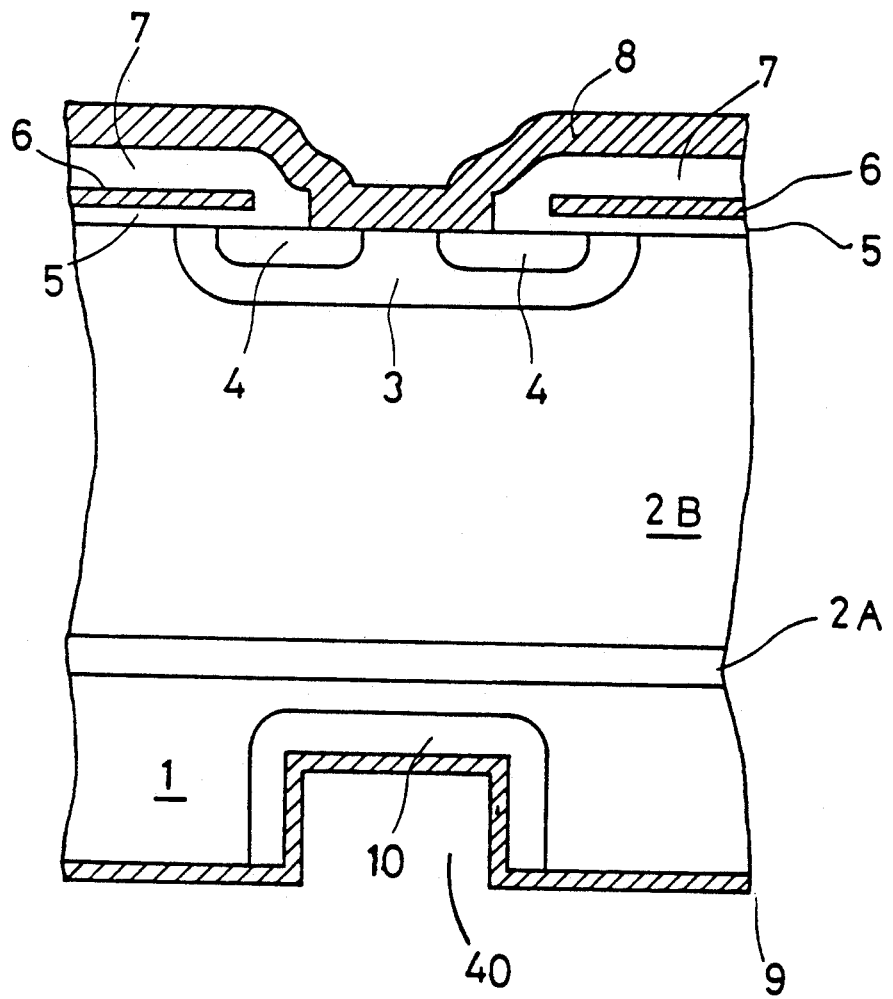
FIG. 5 is a cross-sectional view of a second preferred embodiment according to the present invention.

FIG. 5 is a cross-sectional view of the IGBT of a second preferred embodiment according to the present invention. The n+ layer 2A is formed on the upper major surface of the p+ substrate 1. The n− layer 2B, p well region 3, n+ diffusion region 4, gate oxide film 5, gate electrode 6, interlayer oxide film 7 and emitter electrode 8 in the second preferred embodiment are formed similarly to those in the IGBT of the first preferred embodiment.

There is formed a groove 40 in the lower major surface of the p+ substrate 1. The n+ diffusion region 10 is formed such that it covers the groove 40 and is not in contact with the n+ layer 2A. The collector electrode 9 is formed on the lower major surface of the p+ substrate 1 as well as on the n+ diffusion region 10 in the groove 40.

The operation of the IGBT thus constructed is substantially similar to that of the IGBT of the first preferred embodiment. In the second preferred embodiment, however, the n+ diffusion region 10 is thinner. This effectively provides a smaller resistance for electrons flowing into the n+ diffusion region 10 toward the drain electrode 9 in the reach-through state, and a large capability to limit the increase in the amount of injected holes when the current density increases to some degree or more by the applied excessive emitter-collector voltage (e.g., short-circuit).

Figure 6:
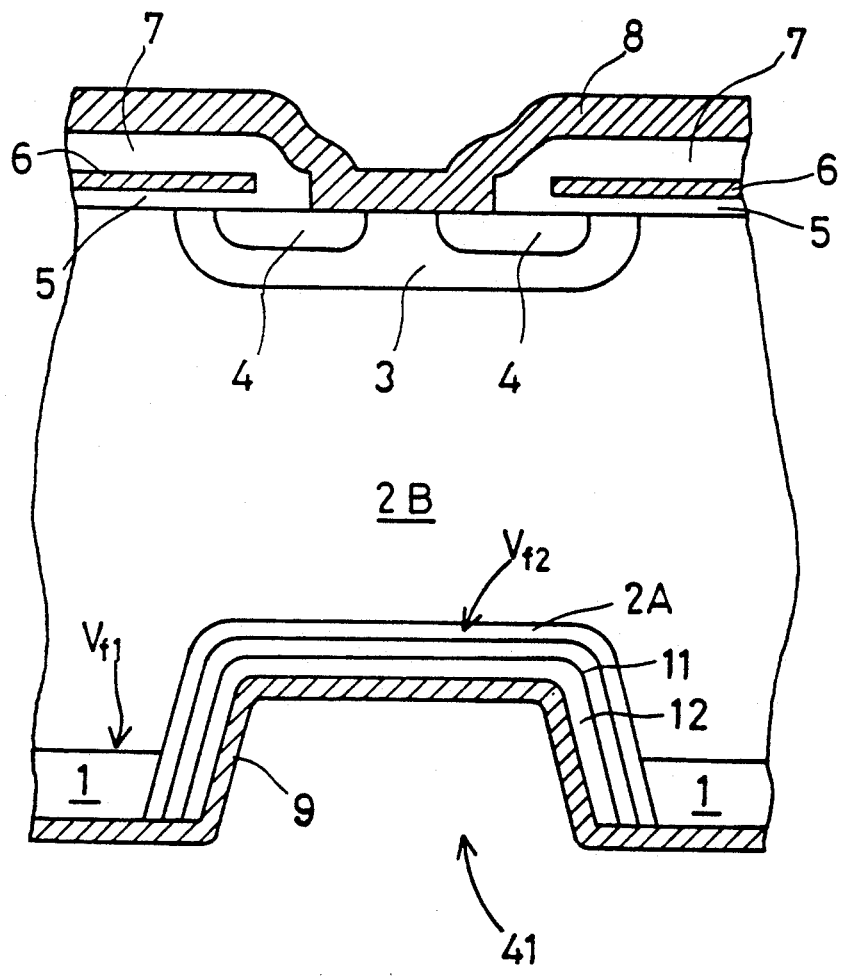
FIG. 6 is a cross-sectional view of a third preferred embodiment according to the present invention.

FIG. 6 is a cross-sectional view of the IGBT of a third preferred embodiment according to the present invention. The construction from the n− layer 2B to the top is similar to that of the IGBT of the first and second preferred embodiments. In the third preferred embodiment, however, the n− layer 2B on the bottom side is provided with a groove 41 excavated from the p+ substrate 1.

The groove 41 is covered with an n+ diffusion region 12, a p diffusion region 11 and the n+ diffusion region 2A. In the groove 41, the regions 12, 11 and 2A lie in this order from inside thereof, and the n+ diffusion region 2A is in contact with the p+ substrate 1 and n− layer 2B. The collector electrode 9 made of metal is formed in contact with the lower major surface of the p+ substrate 1 and with the n+ diffusion region 12 as well as with the ends of the p diffusion region 11 and n+ diffusion region 2A.

The operation of the IGBT thus constructed in the OFF-state is similar to that of the conventional IGBT. When the emitter and gate electrodes 8 and 6 are at the same potential and positive bias is applied to the collector electrode 9, the depletion layer extends from the pn junction formed by the p well region 3 and n− layer 2B toward the n− layer 2B. This holds the voltage in the OFF-state. The depletion layer is adapted not to reach the p+ substrate 1.

In the ON-state, when the gate electrode 6 is positive-biased relative to the emitter electrode 8, the n-inversion occurs to form the n-channel in the p well region 3 immediately under the gate electrode 6. Electrons flow from the n+ diffusion region 4 through the n-channel to the n− layer 2B. The voltage retention goes eliminated in the p well region 3 and n− layer 2B. The potential between the p+ substrate 1 and the n− layer 2B is in the forward direction as well as the p diffusion region 11 and the n− layer 2B through the n+ diffusion region 2A, so that holes flow from the n− layer 2B to the p well region 3. These operations are the same as in the prior art.

In the third preferred embodiment, however, the n− layer 2B is not in contact with the p+ substrate 1 but is connected to the p diffusion region 11 through the n+ layer 2A at the top of the groove 41. A potential difference $V_{j2}$ at the pn junction formed by the n+ layer 2A and p diffusion region 11 is larger than a potential difference $V_{j1}$ at the pn junction formed by the n− layer 2B and p+ substrate 1.

While the current density is small, the amount of holes injected from the p+ substrate 1 is large, and the resultant modulation increases the concentration of electrons in the n− layer 2B. The increased concentration of electrons in the n− layer 2B due to the hole current and modulation permits the low ON-resistance.

As the current density increases, the depletion layer extends from the n+ diffusion region 12 toward the n+ layer 2A in the p diffusion region 11. When the depletion layer reaches the n+ layer 2A, the electronic current directly reaches the n+ diffusion region 12. In this state, the further forward bias is unliable to be applied to the pn junction formed by the n− layer 2B and p+ substrate 1, so that the amount of holes injected from the p+ substrate 1 is no longer liable to increase.

As mentioned above, the holes are effectively injected at the normal current density. On the other hand, when the current density increases to some degree or more by the applied excessive emitter-collector voltage (e.g., short-circuit), the increase in the amount of injected holes is limited, to thereby prevent the breakdown of the device due to the excessive current density.

Hereinafter discussed is a method of fabricating the foregoing IGBT.

Figure 7:
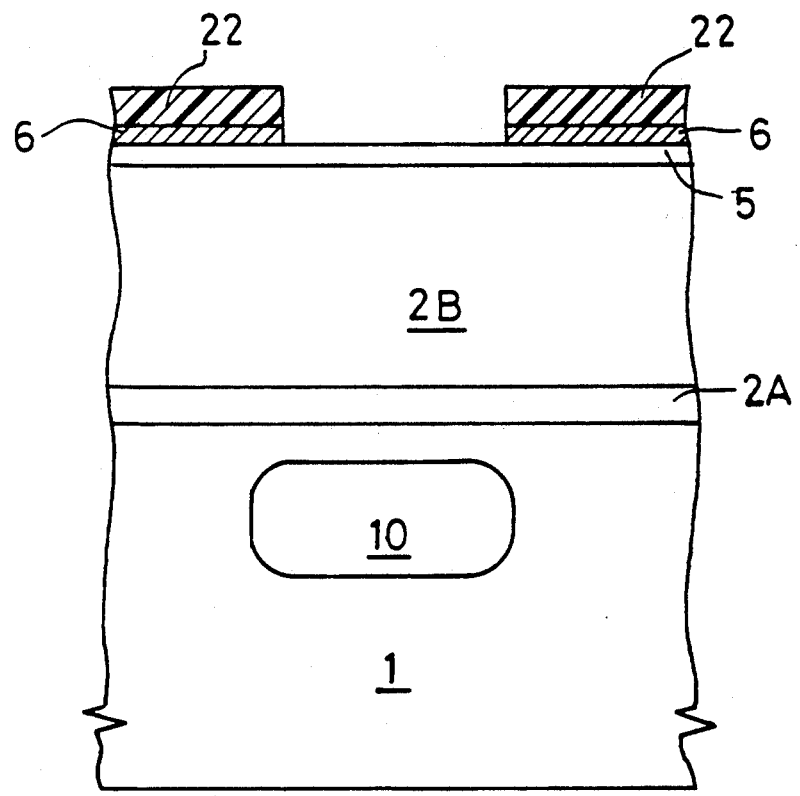
FIGS. 7, 8, 10 and 11 are cross-sectional views of a fourth preferred embodiment in sequence of fabrication according to the present invention.
Figure 8:
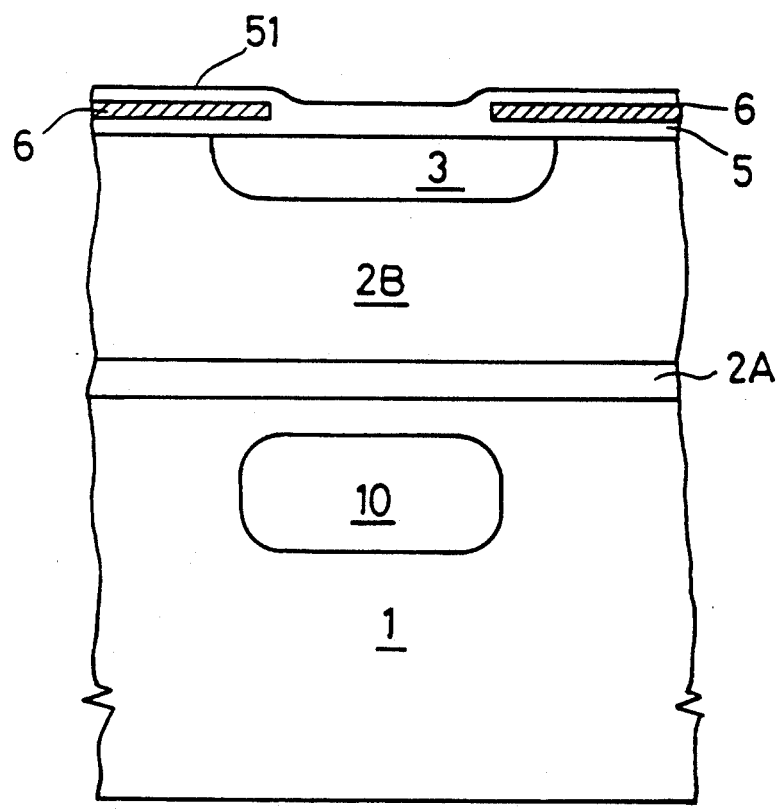

FIGS. 7 and 8 illustrate the method of fabricating the IGBT according to a fourth preferred embodiment of the present invention, in which cross sections of the IGBT of the first preferred embodiment are shown in sequence of fabrication.

Figure 9:
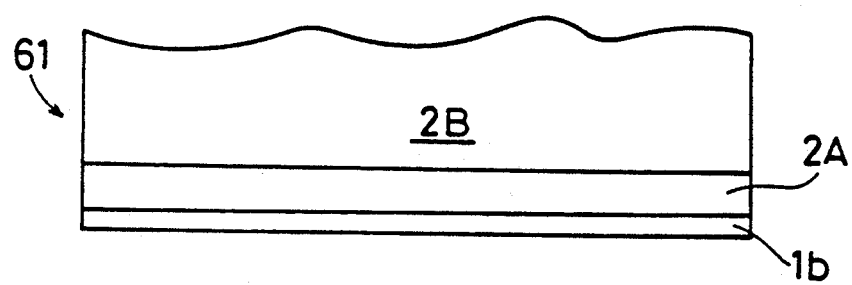
FIG. 9 is a cross-sectional view of a modification of the fourth preferred embodiment.
Figure 9:
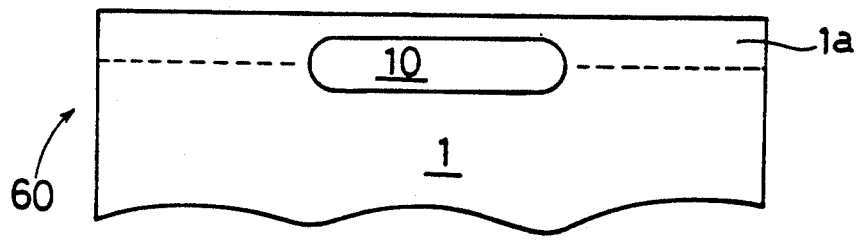

Initially, n-type impurities are selectively introduced into the p+ substrate 1 from the upper major surface, and the thickness of the p+ substrate 1 is increased by the epitaxial growth technique. The n+ and n− layers 2A and 2B are formed on the p+ substrate 1 by the epitaxial growth technique, and the n+ diffusion region 10 is formed in the p+substrate 1 by annealing. An alternative to these steps is described below with reference to FIG. 9. Initially, n-type impurities are selectively introduced into the p+ substrate 1 from the upper major surface and are epitaxially grown to form an epitaxial layer 1a. A semiconductor structure 60 is thus provided which includes the p+ substrate 1 and epitaxial layer 1a. On the other hand, the n+ layer 2A is formed by diffusing impurities into the n− layer 2B, and a p layer 1b is formed by diffusing p-type impurities. A semiconductor structure 61 is thus provided which includes the n− layer 2B, n+ layer 2A and p layer 1b. The semiconductor structures 60 and 61 are bonded together through the p layer 1b and epitaxial layer 1a. In this case, the selectively introduced n-type impurities are diffused by annealing and the like during the bonding, so that the n+ diffusion region 10 is formed. The n+ diffusion region 10 is also diffused by subsequent heat treatments.

The oxide film 5 is formed over the n− layer 2B. Polysilicon is deposited on the oxide film 5 and is patterned by resist 22 to form the gate electrode 6, as shown in FIG. 7.

Figure 10:
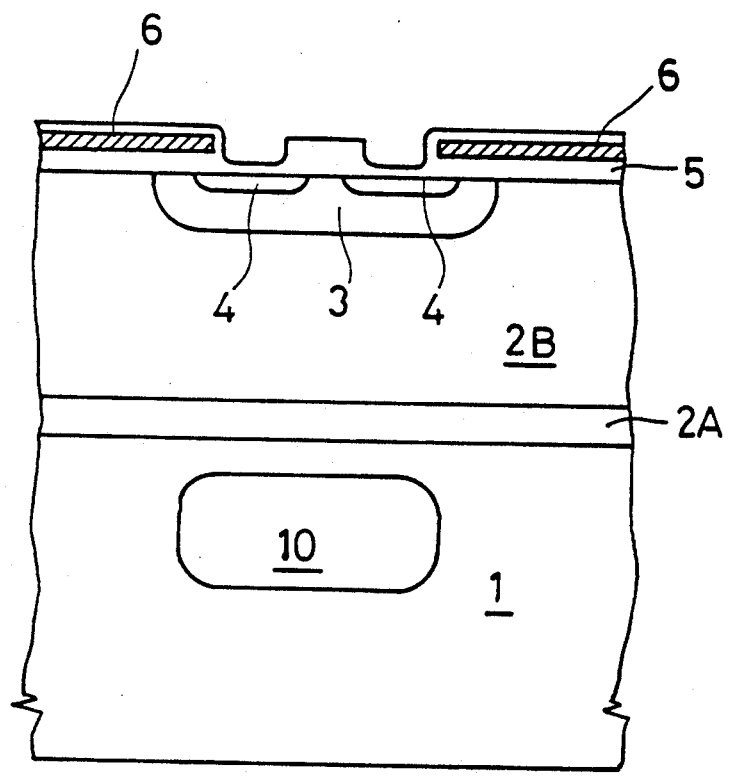

The resist 22 is removed. After the implantation of boron using the gate electrode 6 as a mask, the boron is diffused by annealing to form the p well region 3. By this annealing, an oxide film 51 is formed on the gate oxide film 5 and gate electrode 6, as shown in FIG. 8. The oxide film 51 is patterned, and deposition of phosphorus and annealing are carried out, so that the n+ diffusion region 4 is formed in the surface of the p well region 3, as shown in FIG. 10.

Figure 11:
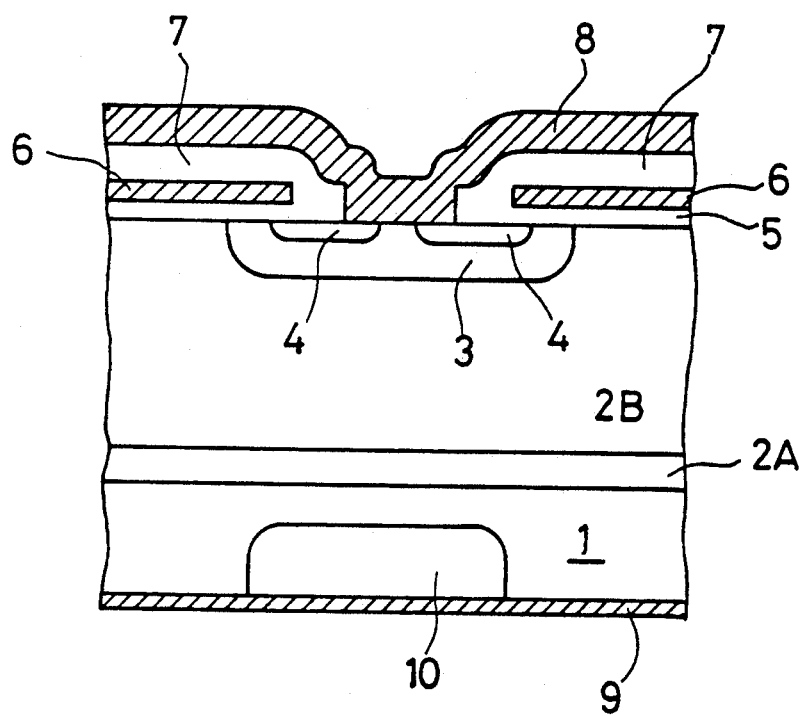

The interlayer oxide film 7 is formed over the top surface and is selectively removed to provide a contact hole on the n+ diffusion region 4 and p well region 3. The emitter electrode 8 is formed by Al-Si sputtering. The lower major surface of the p+ substrate 1 is ground up to the n+ diffusion region 10. The collector electrode 9 is formed by evaporation over the exposed n+ diffusion region 10 and the p+ substrate 1, and is electrically brought into contact with them, as shown in FIG. 11. This accomplishes the IGBT of FIG. 1.

Description will now be given of the method of fabricating the IGBT according to a fifth preferred embodiment of the present invention. FIGS. 12 to 16 show cross sections of the IGBT of the second preferred embodiment in sequence of fabrication.

Figure 12:
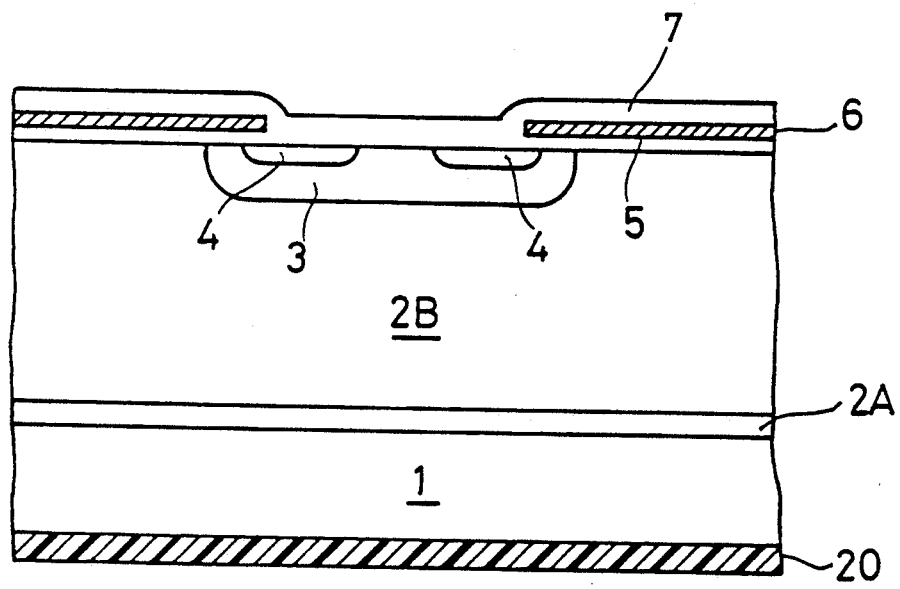
FIGS. 12 to 16 are cross-sectional views of a fifth preferred embodiment in sequence of fabrication according to the present invention.

Initially, the n+ and n layers 2A and 2B are formed on the upper major surface of the p+ substrate 1 by the epitaxial growth technique. The oxide film 5 is formed over the n− layer 2B, and the deposition and patterning of polysilicon are carried out, to form the gate electrode 6. Subsequently, the p well region 3, n+ diffusion region 4 and interlayer oxide film 7 are formed in the same manner as in the fourth preferred embodiment. The p+ substrate 1 on the lower major surface is coated with resist 20, as shown in FIG. 12.

Figure 13:
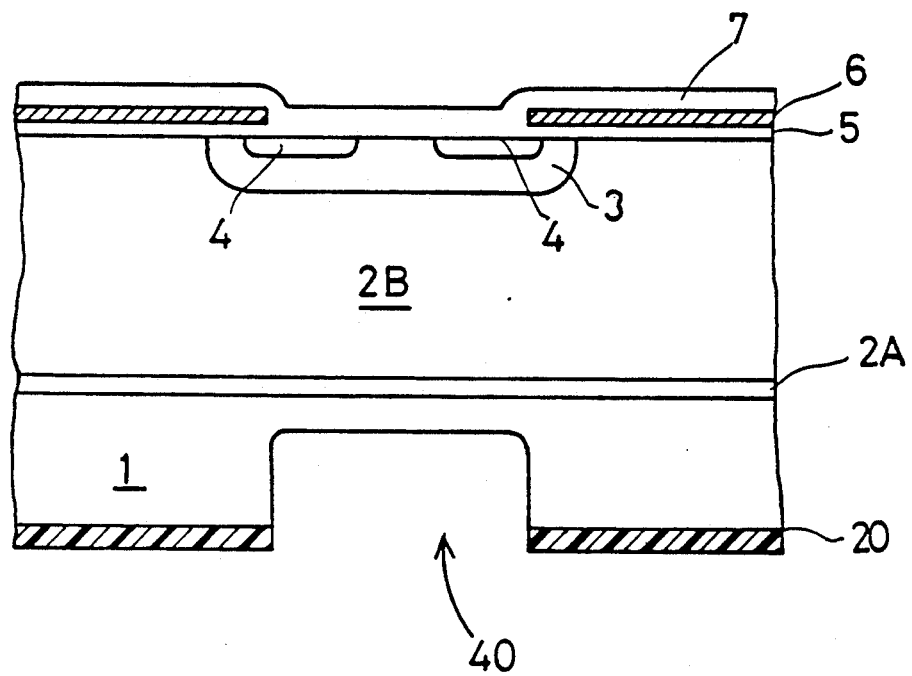
Figure 14:
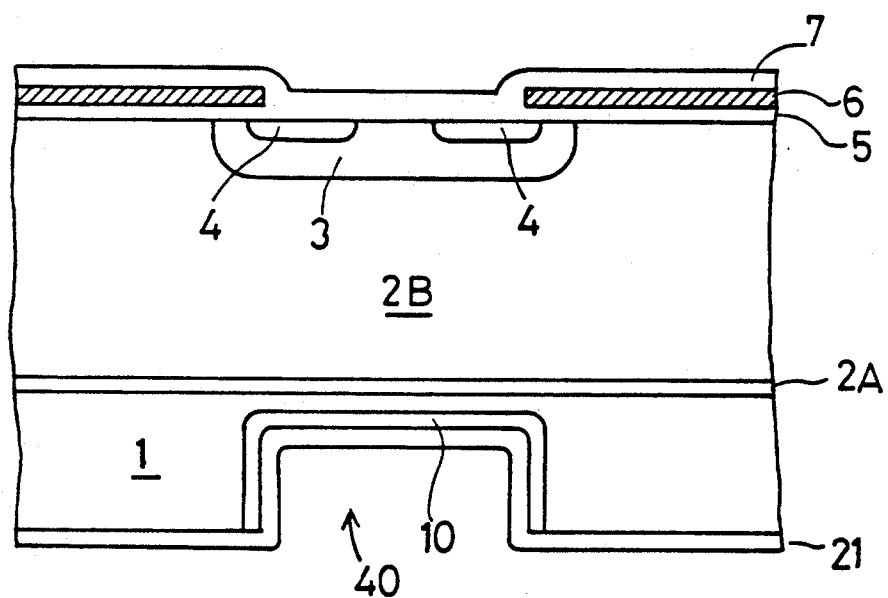

The resist 20 is patterned and the p+ substrate 1 is etched to form the groove 40, as shown in FIG. 13. The implantation of phosphorus and annealing are carried out to form the n+ diffusion region 10. By this annealing, an oxide film 21 is formed on the n+ diffusion region 10 and p+ substrate 1, as shown in FIG. 14.

Figure 15:
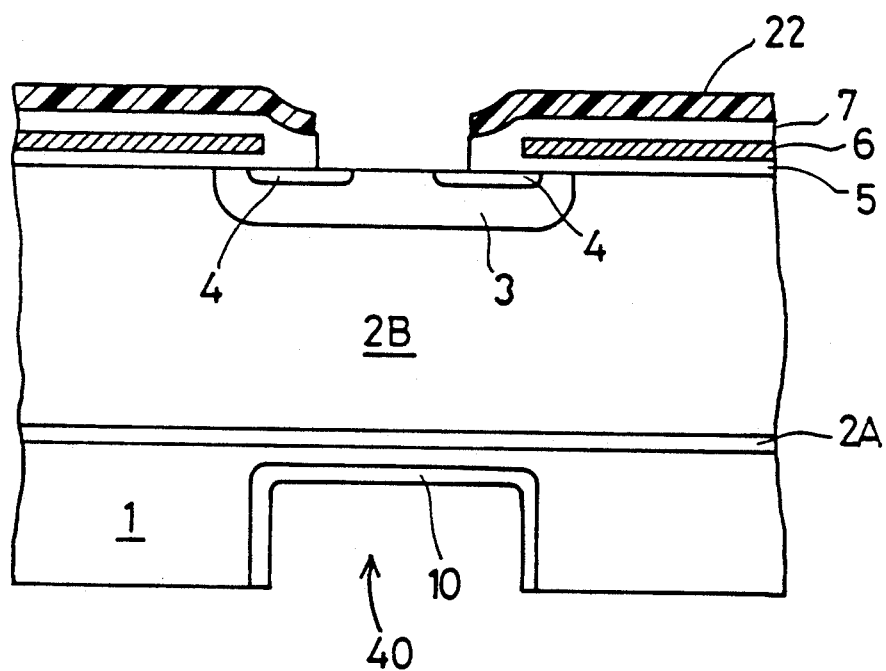
Figure 16:
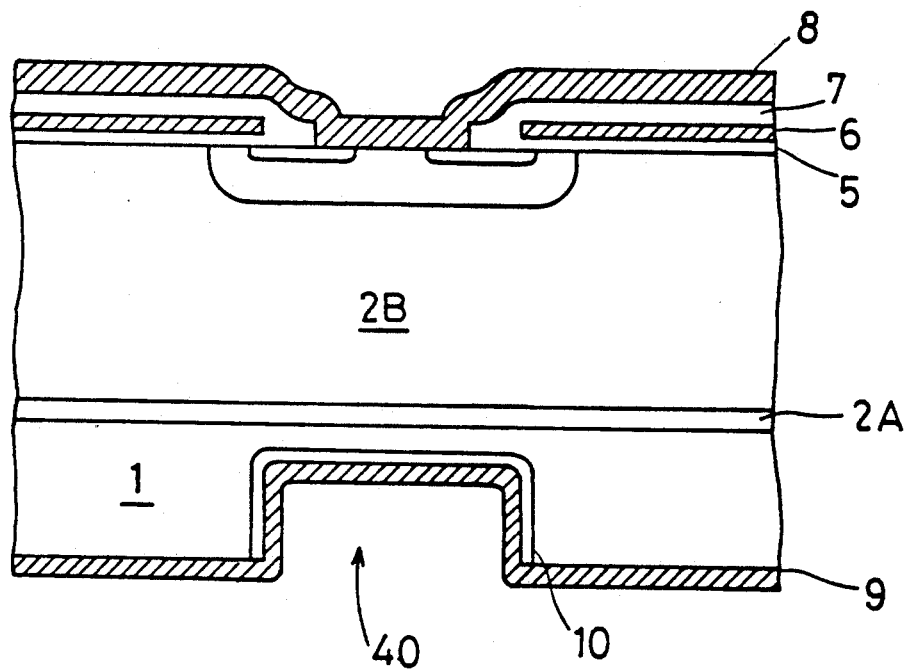

The resist 22 is patterned on the interlayer oxide film 7. Masked with the patterned resist 22, the interlayer oxide film 7 is etched to form a contact hole. At the same time, the oxide film 21 is removed, as shown in FIG. 15. The resist 22 is removed, and the Al-Si sputtering is performed over the top surface, to form the emitter electrode 8. The drain electrode 9 is formed by evaporation over the lower major surface of the p+ substrate 1 as well as the groove 40. FIG. 16 shows the completion of the IGBT of FIG. 5.

Description will now be given of the method of fabricating the IGBT according to a sixth preferred embodiment according to the present invention. FIGS. 17 to 23 show cross sections of the IGBT of the third preferred embodiment in sequence of fabrication.

Figure 17:
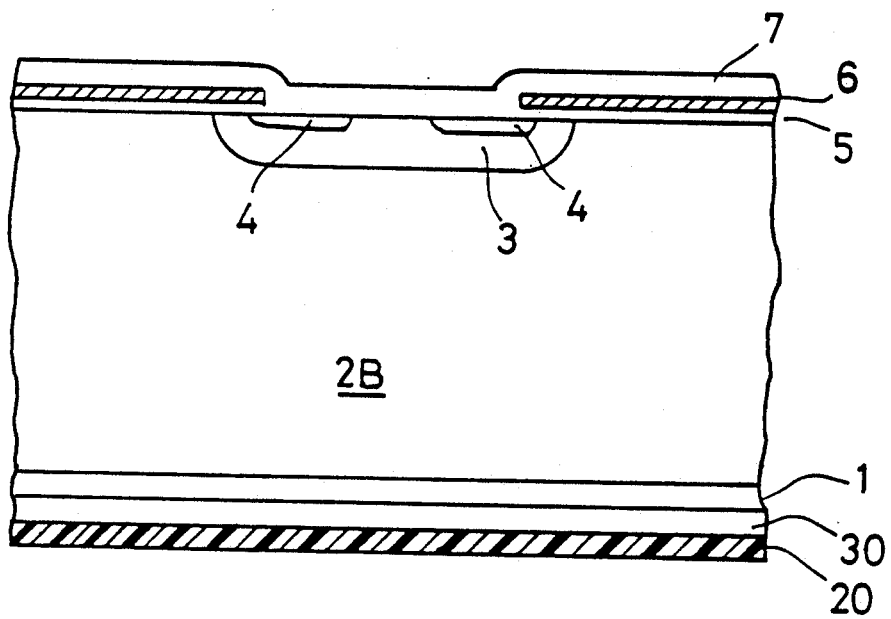
FIGS. 17 to 23 are cross-sectional views of a sixth preferred embodiment in sequence of fabrication according to the present invention.

The n− layer 2B is formed on the upper major surface of the p+ substrate 1 by the epitaxial growth technique. Subsequently, the oxide film 5, p well region 3, n+ diffusion region 4, gate electrode 6 and interlayer oxide film 7 are formed in the same manner as in the fifth preferred embodiment. A nitride film 30 and the resist 20 are formed on the lower major surface of the p+ substrate 1, as shown in FIG. 17.

Figure 18:
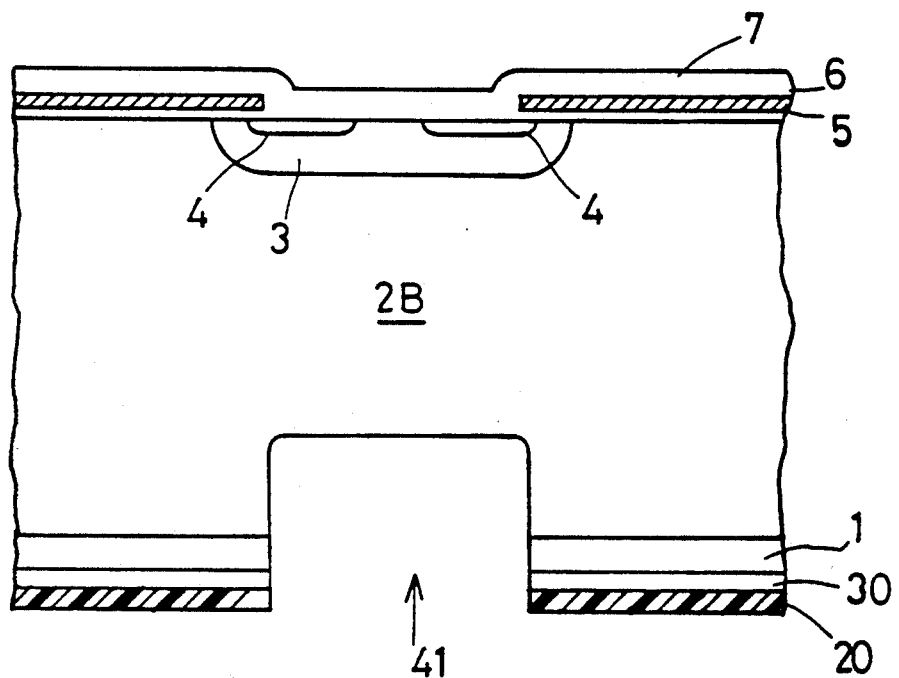

The resist 20 is patterned and the nitride film 30 is selectively etched away. Masked with the patterned nitride film 30, the p+ substrate 1 and n− layer 2B are etched to form the groove 41, as shown in FIG. 18.

Figure 19:
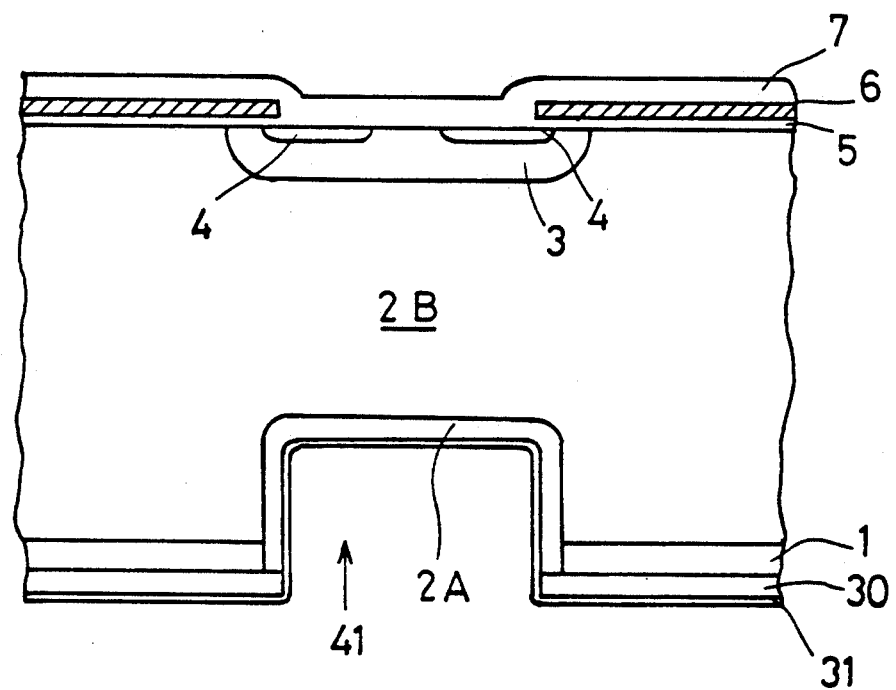
Figure 20:
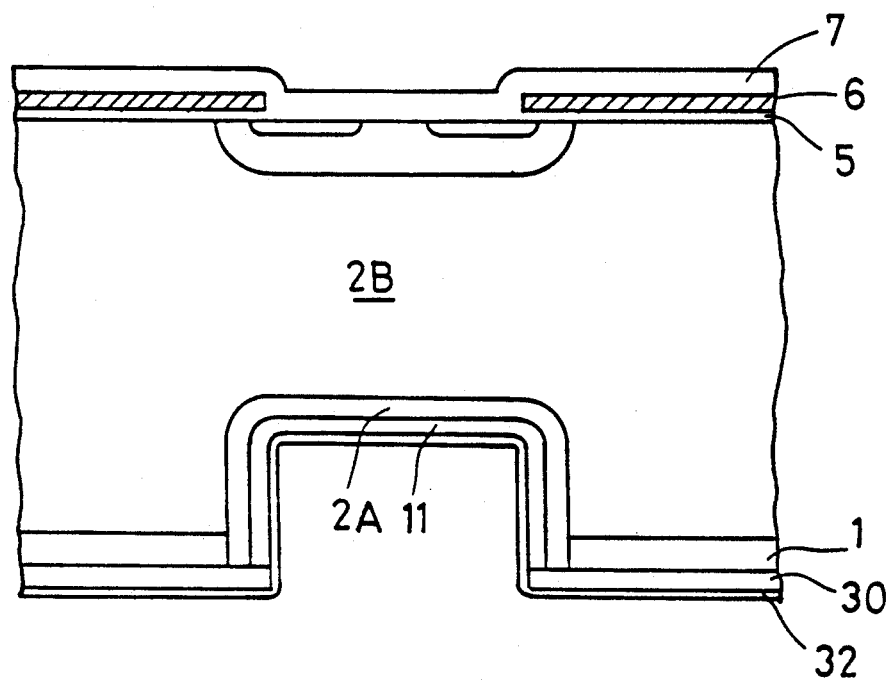
Figure 21:
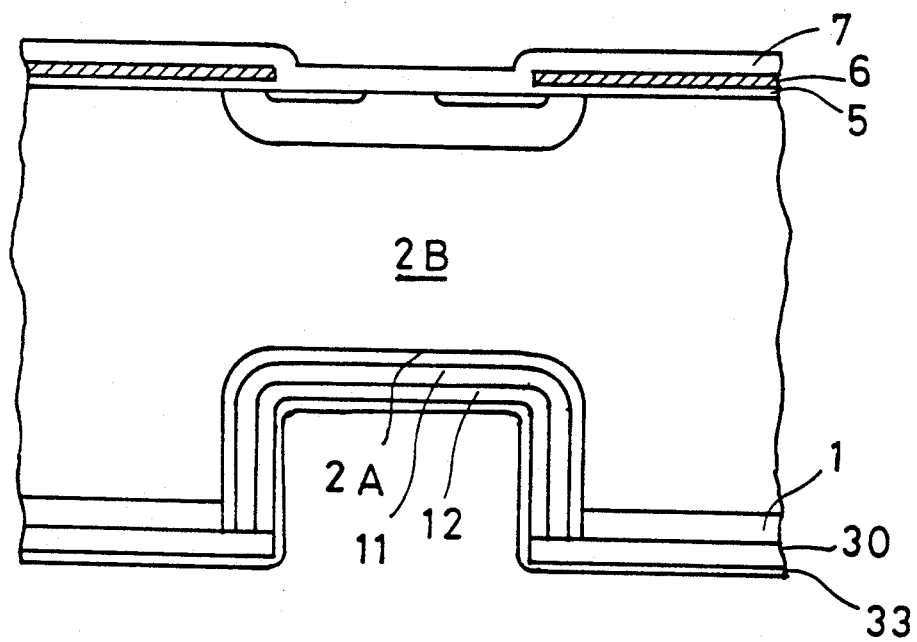

The implantion of phosphorus is carried out using the nitride film 30 as a mask, and annealing is carried out to form the n+ layer 2A. By this annealing, an oxide film 31 is formed, as shown in FIG. 19. The oxide film 31 is removed. The implantion of boron and annealing are carried out masked with the nitride film 30 to form an oxide film 32, as shown in FIG. 20.

The oxide film 32 is removed. Masked with the nitride film 30, the implantation of phosphorus and annealing are carried out to form the n+ diffusion region 12. That is, triple diffusion is performed using the nitride film 30 as a mask. By this annealing, an oxide film 33 is formed. The nitride film 30 is not etched by the etchant for removing the oxide films 31 and 32.

Figure 22:
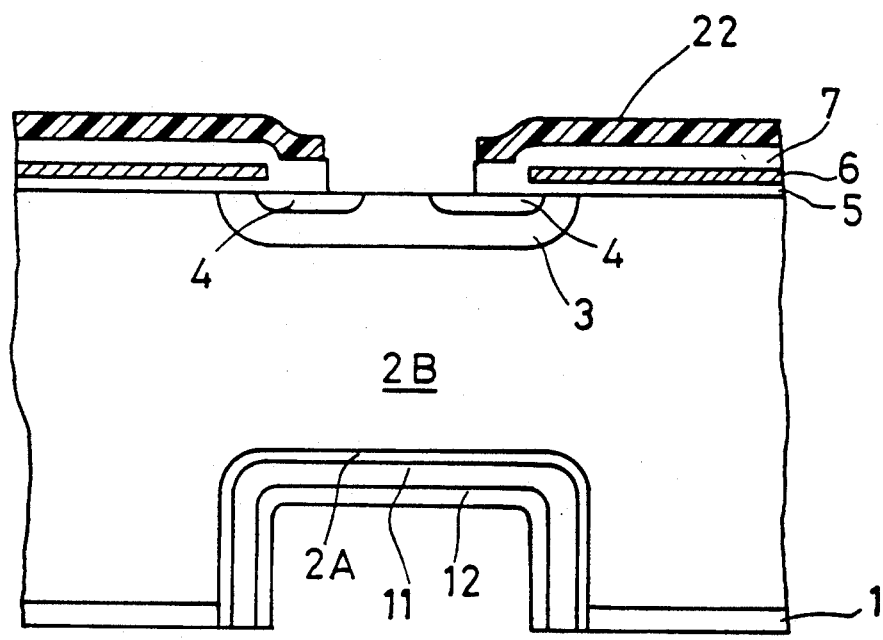
Figure 23:
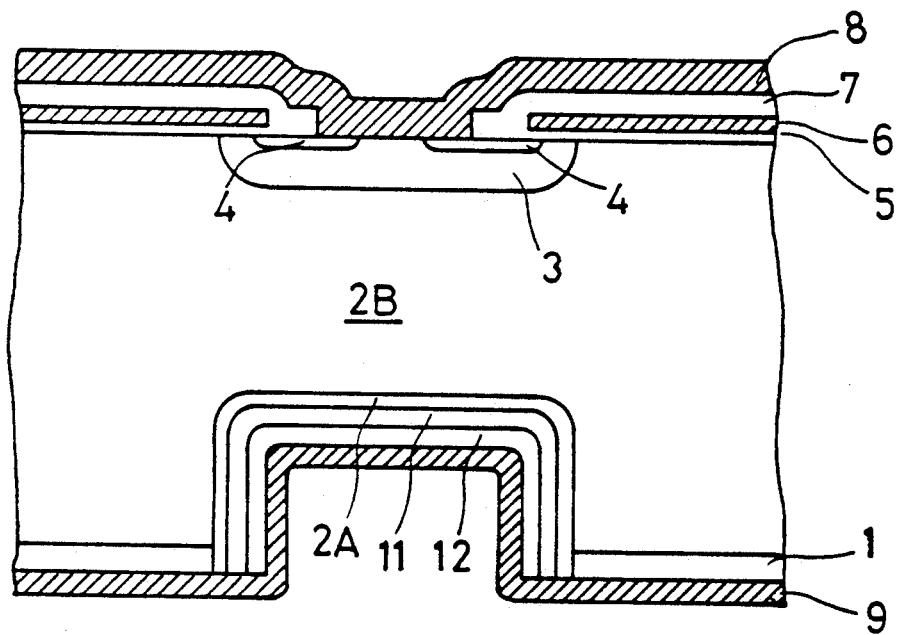
Figure 24:
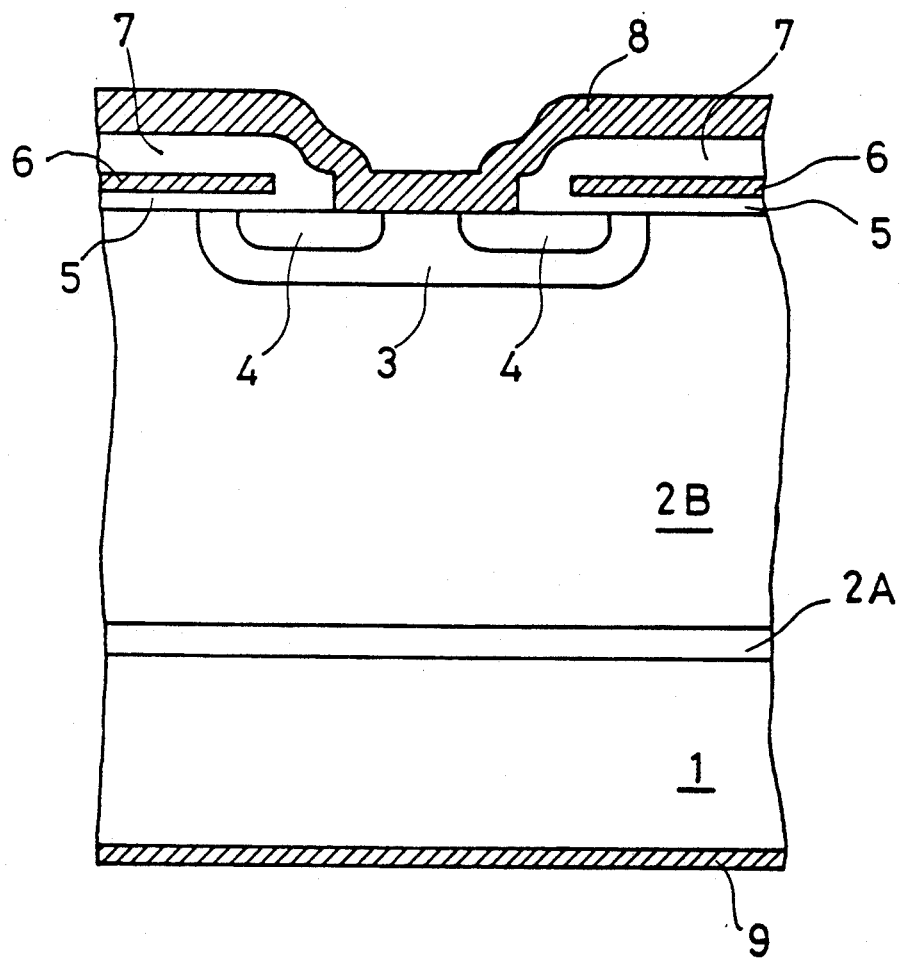
FIG. 24 is a cross-sectional view of a conventional IGBT.

Similarly to the fifth preferred embodiment, the resist 22 on the interlayer oxide film 7 is patterned, and the interlayer oxide film 7 is selectively removed, so that the contact hole is formed. At this time, the oxide film 33 and the nitride film 30 are removed, as shown in FIG. 22. The resist 22 is removed. The Al-Si sputtering is carried out over the top surface to form the emitter electrode 8. The drain electrode 9 is formed by evaporation over the bottom surface including the groove 41. FIG. 23 shows the completion of the IGBT of FIG. 6. In the foregoing embodiments, the n+ diffusion region 10 is shown as positioned immediately under the emitter electrode 8. It will be apparent from the operations that the effects of the present invention do not limit the position of the n+ diffusion region 10.

While the invention has been shown and described in detail, the foregoing description is in all aspects illustrative and not restrictive. It is therefore understood that numerous modifications and variations can be devised without departing from the scope of the invention.

I claim:

1. An Insulated Gate Bipolar Transistor comprising:
   a first conductivity type first semiconductor layer having first and second major surfaces;
   a second conductivity type second semiconductor layer formed on said first major surface;
   a first conductivity type third semiconductor layer selectively formed in a surface of said second semiconductor layer which is opposite to said first semiconductor layer;
   a second conductivity type fourth semiconductor layer selectively formed in a surface of said third semiconductor layer;
   a groove extending from said second major surface to said second semiconductor layer;
   an insulative layer formed on part of said surface of said third semiconductor layer which is between said second and fourth semiconductor layers;
   a control electrode formed in said insulative layer;
   a first electrode formed over said third and fourth semiconductor layers;
   a second conductivity type fifth semiconductor layer, a first conductivity type sixth semiconductor layer and a second conductivity type seventh semiconductor layer of impurity concentration higher than that of said second semiconductor layer, which are stacked in order from inside of said groove; and
   a second electrode formed for connection to said first semiconductor layer on said second major surface and to said fifth and sixth semiconductor layers.

2. The Insulated Gate Bipolar Transistor of claim 1, wherein a depletion layer extends in said sixth semiconductor layer from said fifth semiconductor layer to said seventh semiconductor layer when a density of current flowing between said first and second semiconductor layers is not less than a predetermined value.

* * * * *